(12) United States Patent
Obata

(10) Patent No.: US 11,569,601 B2
(45) Date of Patent: Jan. 31, 2023

(54) SOCKET AND INSPECTION SOCKET

(71) Applicant: Enplas Corporation, Saitama (JP)

(72) Inventor: Keiji Obata, Saitama (JP)

(73) Assignee: Enplas Corporation, Saitama (JP)

( * ) Notice: Subject to any disclaimer, the term of this patent is extended or adjusted under 35 U.S.C. 154(b) by 42 days.

(21) Appl. No.: 17/198,304

(22) Filed: Mar. 11, 2021

(65) Prior Publication Data

US 2022/0294139 A1 Sep. 15, 2022

(51) Int. Cl.
H01R 13/24 (2006.01)
H01R 12/91 (2011.01)
H01R 12/71 (2011.01)

(52) U.S. Cl.
CPC .......... *H01R 12/91* (2013.01); *H01R 12/716* (2013.01)

(58) Field of Classification Search
CPC ............................ H01R 12/91; H01R 12/716
See application file for complete search history.

(56) References Cited

U.S. PATENT DOCUMENTS

| | | | | |
|---|---|---|---|---|
| 6,267,603 B1 * | 7/2001 | Yamamoto | ........... | G01R 1/0483 439/70 |
| 6,354,856 B1 * | 3/2002 | Shimada | .............. | H05K 7/1023 439/73 |
| 6,506,082 B1 * | 1/2003 | Meek | ................. | H01R 13/2421 439/700 |
| 6,966,783 B2 * | 11/2005 | Hachuda | ............ | G01R 31/2886 439/700 |
| 7,393,232 B2 * | 7/2008 | Morinari | .............. | G01R 1/0408 439/71 |
| 7,635,269 B2 * | 12/2009 | Oda | .................... | H01R 13/2421 439/86 |
| 2003/0124895 A1 * | 7/2003 | Winter | ............... | H01R 13/2421 439/219 |
| 2004/0018762 A1 * | 1/2004 | Takayama | ............ | H05K 7/1061 439/266 |
| 2004/0029412 A1 * | 2/2004 | Hachuda | .............. | H01R 12/714 439/66 |
| 2006/0094280 A1 * | 5/2006 | Hayakawa | ........... | H01R 13/193 439/331 |
| 2006/0228914 A1 * | 10/2006 | Oda | .................... | H01R 13/2421 439/71 |

(Continued)

FOREIGN PATENT DOCUMENTS

JP 2002-164136 6/2002

*Primary Examiner* — Abdullah A Riyami
*Assistant Examiner* — Nelson R. Burgos-Guntin

(57) ABSTRACT

A socket configured to electrically connect a first electric component and a second electric component, the socket including: a base part including a top surface and a bottom surface; a contact pin provided to extend through the base part and including a pin lower end exposed from the bottom surface; and an abutment part provided in the base part, and including an abutment lower end, the abutment lower end being exposed from the bottom surface to abut on the second electric component and configured to be movable in a vertical direction, the abutment part being configured such that the abutment lower end abuts on the second electric component approaching, in a process of attaching the second electric component, the base part from below to adjust a posture of the base part with respect to the second electric component.

7 Claims, 6 Drawing Sheets

(56) References Cited

U.S. PATENT DOCUMENTS

| | | | |
|---|---|---|---|
| 2008/0032529 A1* | 2/2008 | Shimada | G01R 1/06722 439/135 |
| 2008/0050944 A1* | 2/2008 | Oda | H01R 12/7082 439/68 |
| 2008/0064270 A1* | 3/2008 | Ohshima | H01R 13/2421 439/841 |
| 2008/0081489 A1* | 4/2008 | MacGregor | H01R 12/88 439/71 |
| 2012/0058683 A1* | 3/2012 | Suzuki | G01R 1/0466 439/660 |
| 2012/0064756 A1* | 3/2012 | Hachuda | G01R 1/0466 384/154 |
| 2012/0100730 A1* | 4/2012 | Yokoyama | G01R 1/0466 439/68 |
| 2013/0057308 A1* | 3/2013 | Yano | G01R 1/06722 324/755.01 |
| 2013/0164963 A1* | 6/2013 | Ueyama | H05K 7/1061 439/331 |
| 2013/0280938 A1* | 10/2013 | Hayakawa | H05K 7/1007 439/310 |
| 2014/0057500 A1* | 2/2014 | Morinari | G01R 1/06722 439/700 |
| 2017/0373416 A1* | 12/2017 | Ueyama | G01R 1/0483 |
| 2019/0173217 A1* | 6/2019 | Miura | G01R 1/073 |
| 2019/0293684 A1* | 9/2019 | Numata | G01R 31/26 |
| 2020/0006882 A1* | 1/2020 | Isagoda | G01R 1/0466 |
| 2020/0303852 A1* | 9/2020 | Wan | H05K 7/1061 |

* cited by examiner

SOCKET AND INSPECTION SOCKET

TECHNICAL FIELD

The present invention relates to a socket and an inspection socket.

BACKGROUND ART

In the related art, IC sockets have been known as sockets for electrically connecting electrical components such as so-called IC packages, which contain integrated circuits (ICs), to external electrical components. IC sockets are used, for example, to inspect the electrical characteristics of the electrical components in shipping inspection of the electrical components.

The IC socket includes, in the base, a contact pin for electrical connection between the electrical component and an external electrical component (e.g., a wiring board). The electrical component is placed on the top side of the base, and the wiring board is attached to the bottom side of the base (see PTL 1). The contact pin is extended through the base, and the lower end of the contact pin is exposed from the lower surface of the base for electrical connection with the wiring board. The wiring board also includes an electrode configured for electrical connection with the lower end of the contact pin and protruded from the surface of the substrate.

CITATION LIST

Patent Literature

PTL 1

Japanese Patent Application Laid-Open No. 2002-164136

SUMMARY OF INVENTION

Technical Problem

In the known socket described above, there is a risk of damaging the lower end of the exposed contact pins by applying unintended force to the lower end of the contact pins through the wiring board when mounting the wiring board, which is an external electrical component, to the bottom surface side of the base. For example, there is a risk of damaging the lower end of the exposed contact pins by catching the lower end of the contact pins with the electrodes of the wiring board during alignment when attaching the wiring board on the bottom surface of the base.

An object of the present invention is to provide a socket and an inspection socket that can protect the exposed contact pin from damage when attaching the electric component to the bottom surface side of the base part from which the contact pin is exposed.

Solution to Problem

A socket according to an embodiment of the present invention is configured to electrically connect a first electric component and a second electric component, the socket including: a base part including a top surface on which the first electric component is placed and a bottom surface to which the second electric component is attached; a contact pin provided to extend through the base part and including a pin lower end exposed from the bottom surface, the contact pin being configured to electrically connect the first electric component and the second electric component; and an abutment part provided in the base part, and including an abutment lower end, the abutment lower end being exposed from the bottom surface to abut on the second electric component and configured to be movable in a vertical direction, the abutment part being configured such that the abutment lower end abuts on the second electric component approaching, in a process of attaching the second electric component, the base part from below to adjust a posture of the base part with respect to the second electric component.

An inspection socket according to an embodiment of the present invention is configured to be used for inspection of electrical characteristics of a first electric components, the inspection socket including the above-mentioned socket.

Advantageous Effects of Invention

According to the present invention, it is possible to protect the exposed contact pin from damage when attaching the electric component to the bottom surface side of the base part from which the contact pin is exposed.

DESCRIPTION OF EMBODIMENTS

In the following, an embodiment of the present invention is elaborated with reference to the drawings.

In the present embodiment, as an example of a socket, an inspection socket for an inspection device for inspecting electrical characteristics of electric components is exemplified. With this inspection device, various tests are conducted for an electric component as an inspection object. For example, whether electric components properly operate and the like are checked in the same environment as the actual use environment of electric components or in an environment with a higher load than the actual environment.

In addition, while a socket according to the present embodiment is an IC socket intended for IC packages as inspection objects, the electric component as the inspection object of the socket may be an electric component different from the IC package. An IC is an electronic circuit, and includes, for example, a transistor, a resistance, a capacitor and an inductor mutually connected to each other on a silicon substrate.

Figure 1:
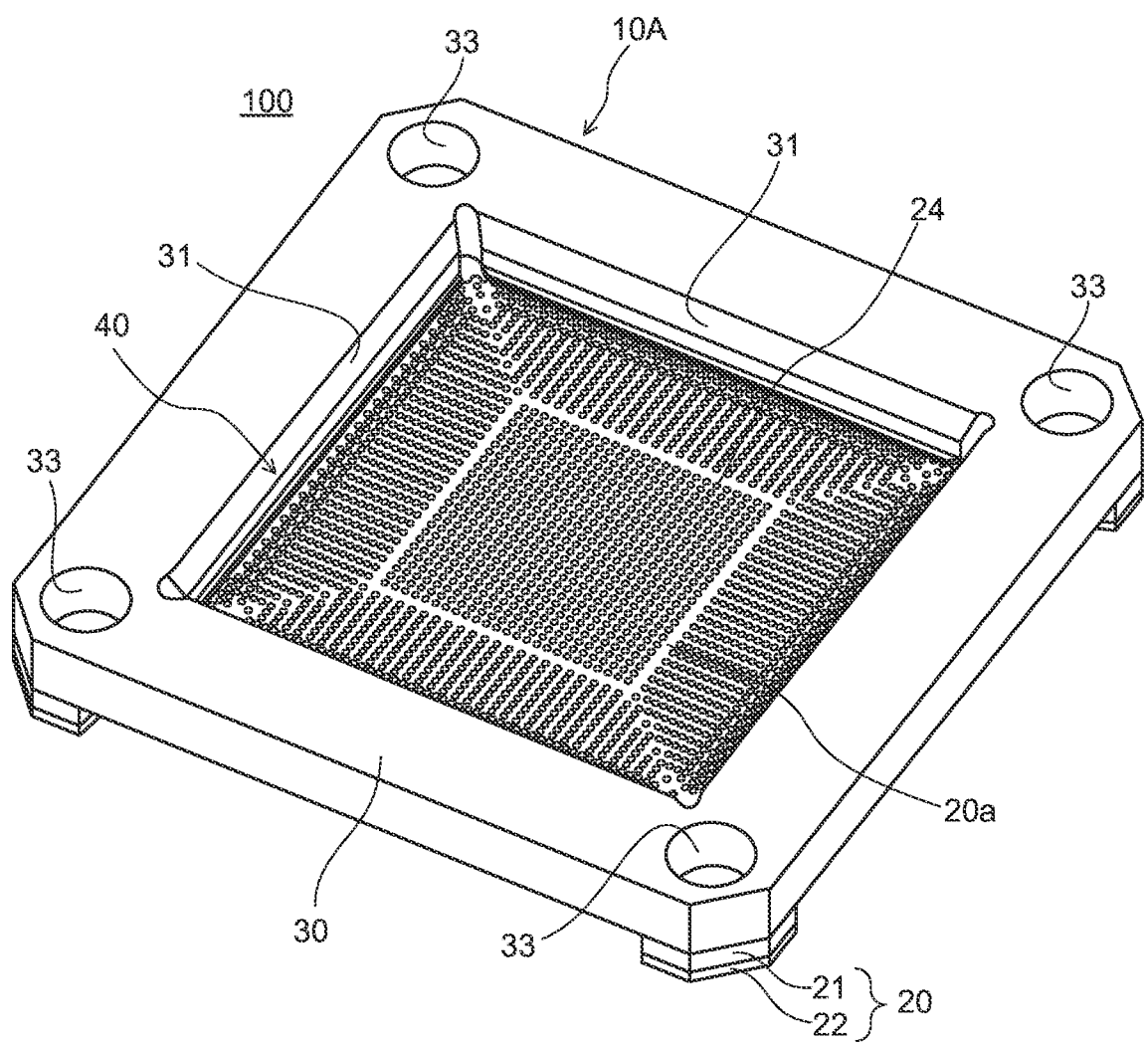
FIG. 1 is a perspective view illustrating a socket and a wiring board according to an embodiment of the present invention, and illustrates a top surface side of the socket.
Figure 2:
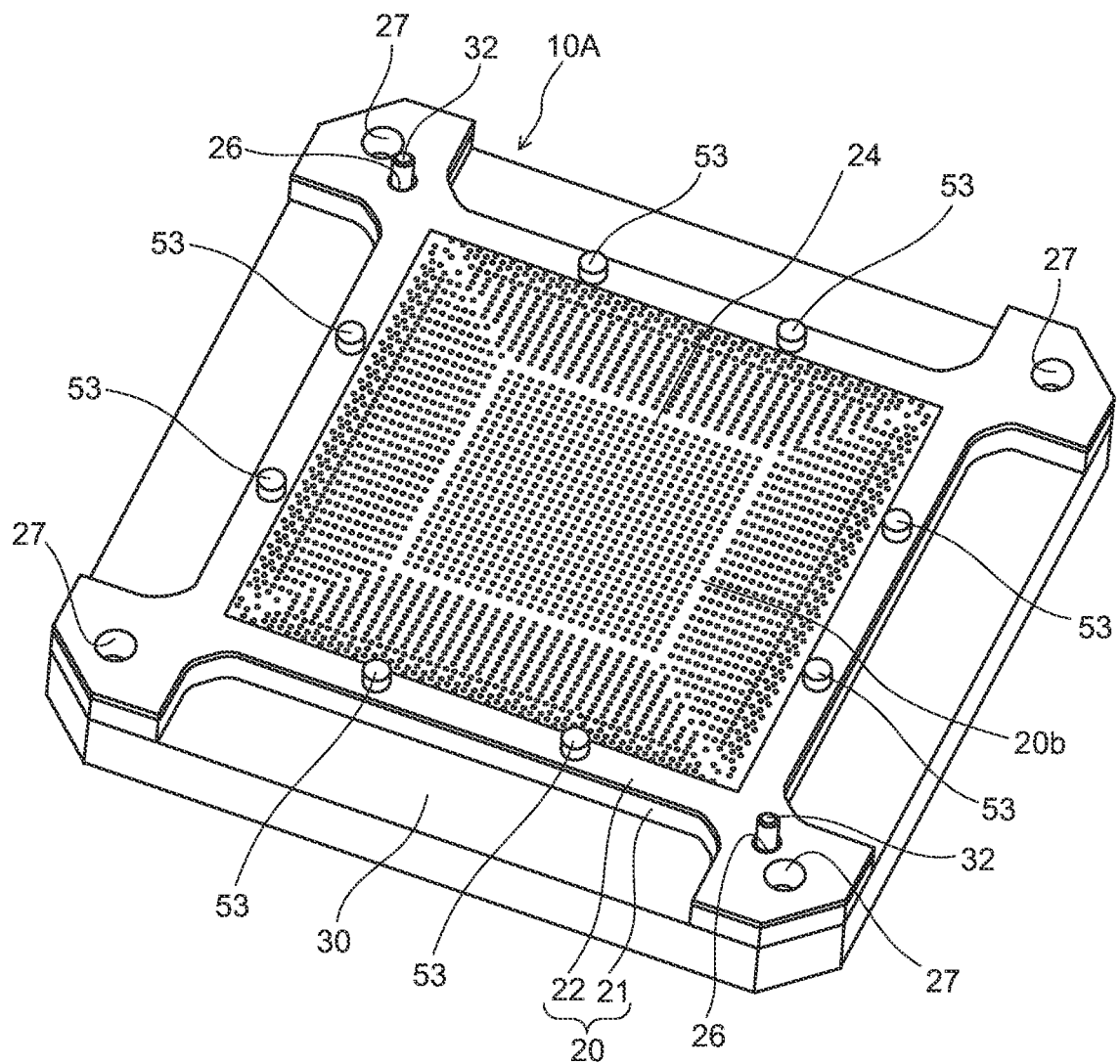
FIG. 2 is a perspective view illustrating a bottom surface side of the socket illustrated in FIG. 1.
Figure 3A:
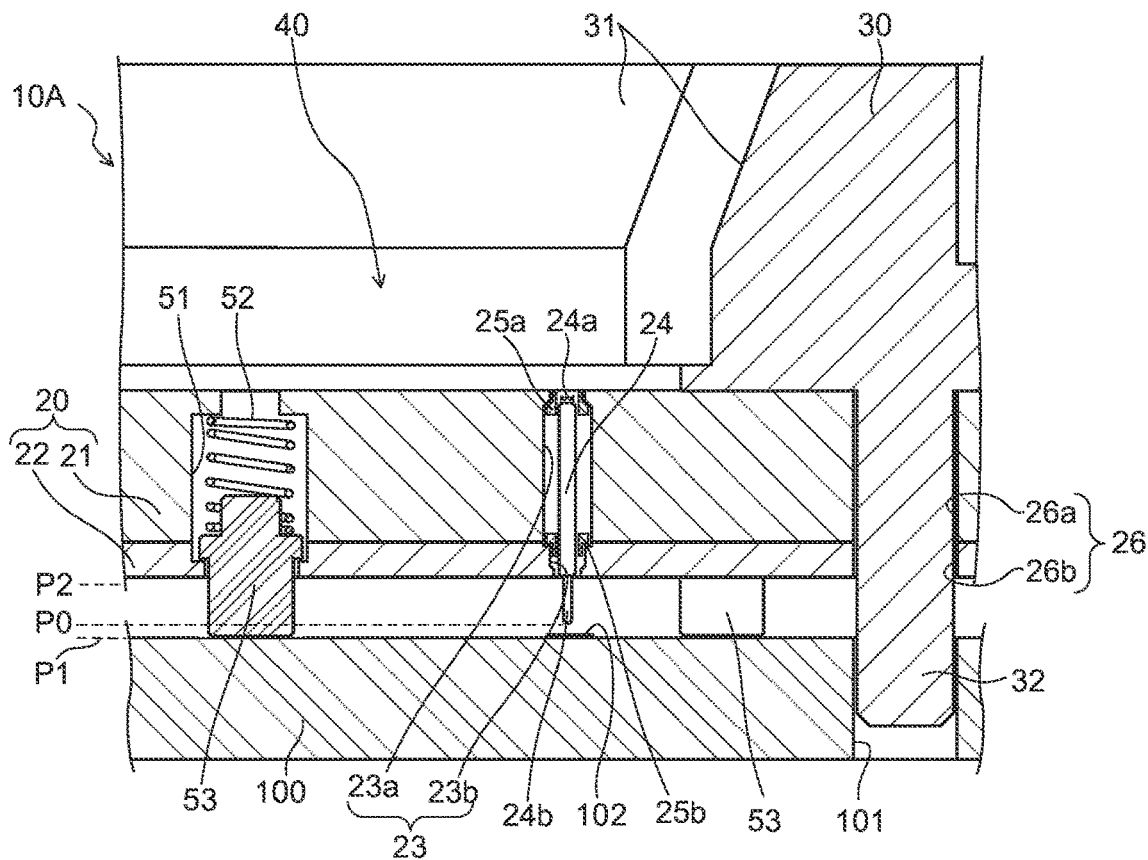
FIG. 3A is a partial sectional view of the socket and the wiring board illustrated in FIG. 1, and illustrates a state where attaching of the wiring board to the socket is started.
Figure 3B:
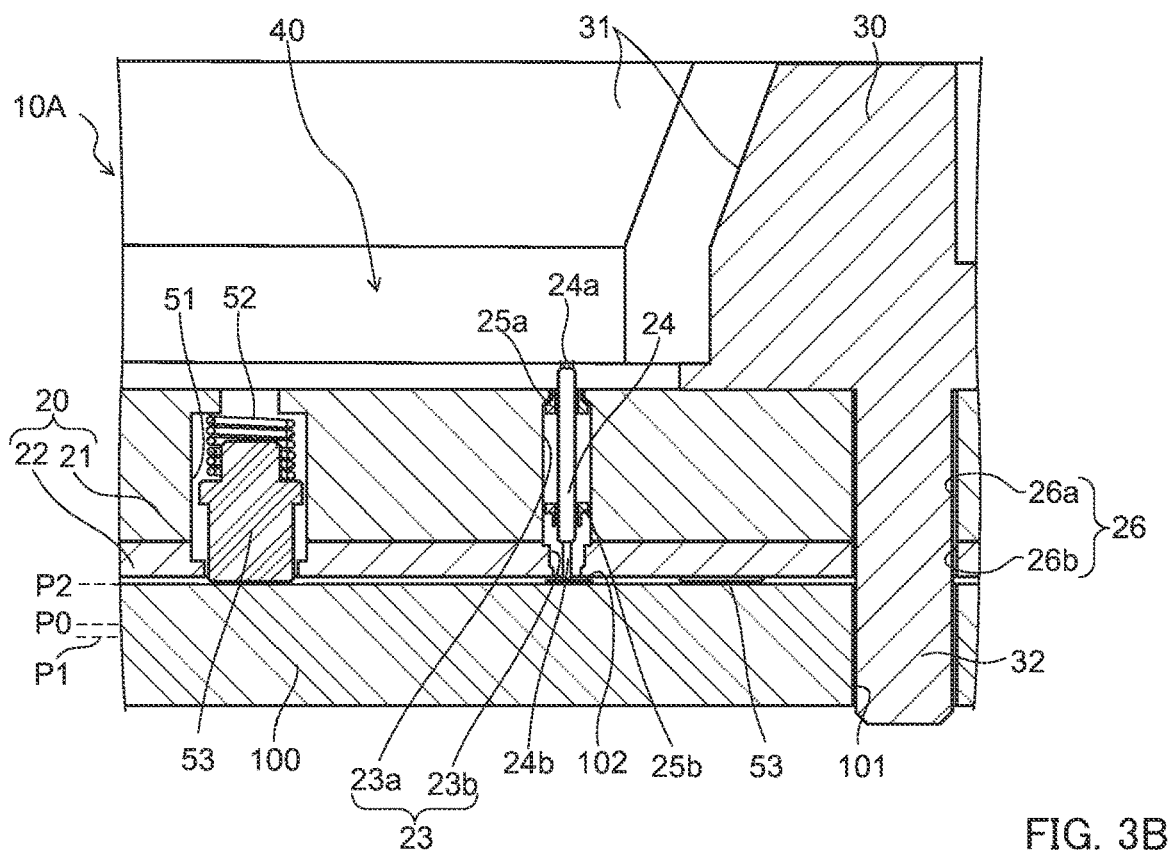
FIG. 3B is a sectional view illustrating the same portion as FIG. 3A, and illustrates a state where attaching of the wiring board to the socket is completed.
Figure 4:
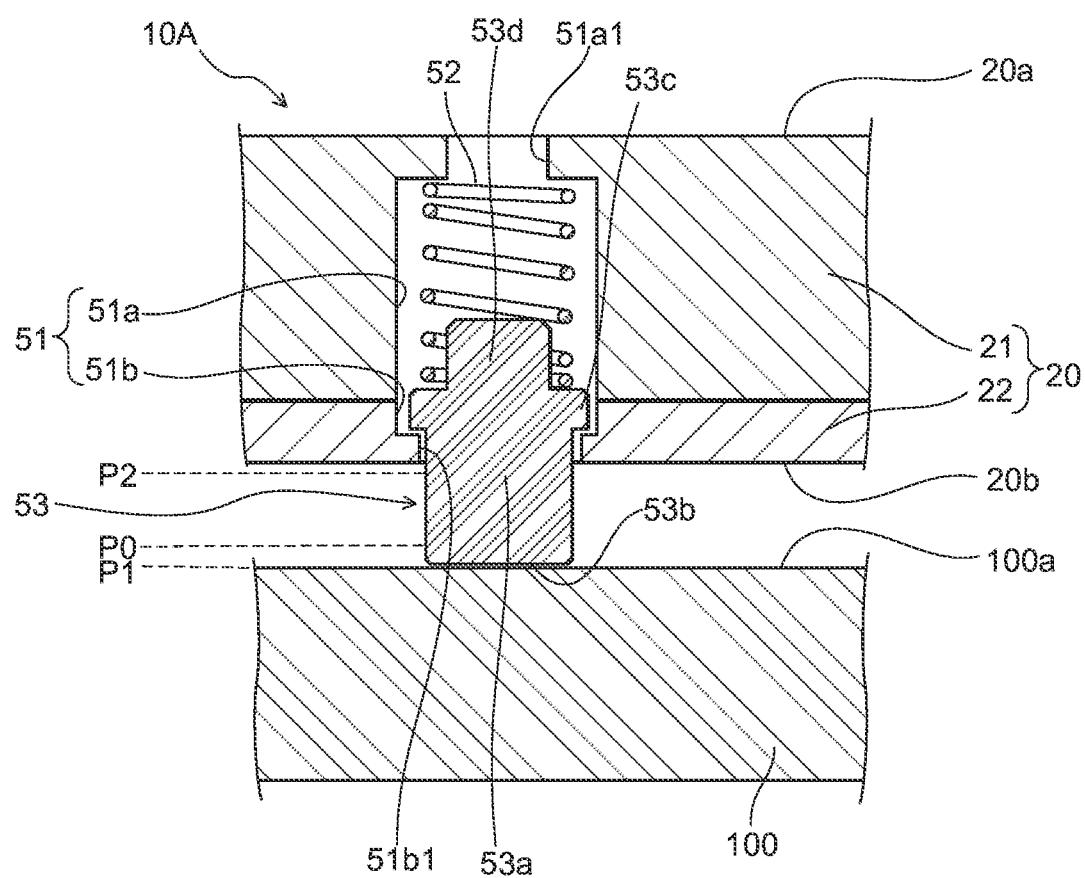
FIG. 4 is an enlarged sectional view of an abutment part illustrated in FIG. 3A.

FIG. 1 is a perspective view illustrating IC socket 10A and wiring board 100 according to the present embodiment, and illustrates the top surface side of IC socket 10A. FIG. 2 is a perspective view illustrating a bottom surface side of IC socket 10A illustrated in FIG. 1. FIG. 3A is a partial sectional view of IC socket 10A and wiring board 100 illustrated in FIG. 1, and illustrates a state where attaching of wiring board 100 to IC socket 10A is started. FIG. 3B is a sectional view illustrating the same portion as FIG. 3A, and illustrates a state where attaching of wiring board 100 to IC socket 10A is completed. FIG. 4 is an enlarged sectional view of an abutment part illustrated in FIG. 3A.

It is to be noted that FIG. 2 illustrates a state where wiring board 100 is detached from IC socket 10A. In addition, in FIG. 3A, cross sections at different positions are illustrated in one drawing for simple illustration of a mutual relationship between contact pin 24, positioning pin 32 and movable member 53 described later. The same applies to FIG. 3B as FIG. 3A.

IC Socket

IC socket 10A includes base part 20 on which an electric component such as an IC package (omitted in the drawing) is placed, and frame part 30 disposed outside top surface 20a of base part 20. The inside of frame part 30 is configured as housing part 40 for housing electric components.

Base Part

For example, base part 20 is a flat member with a predetermined thickness, and constitutes the bottom portion of housing part 40. To be more specific, top surface 20a of base part 20 serves as the bottom surface of housing part 40. It is to be noted that in the present embodiment, the thickness direction of base part 20 is referred to as a vertical direction, and "up" and "down" in the following description means up and down in the vertical direction.

Base part 20 includes upper plate 21 and lower plate 22. Upper plate 21 is provided with hole 23a extending through it in the vertical direction, and lower plate 22 is also provided with hole 23b extending through it in the vertical direction. Through hole 23a and through hole 23b are disposed to form a single through hole 23 when upper plate 21 and lower plate 22 are aligned and assembled. That is, through hole 23 extends through base part 20 in the vertical direction, and a plurality of such through holes 23 are provided in base part 20.

Contact pin 24 is inserted to through hole 23. In the present embodiment, as an example, contact pin 24 configured as a coaxial line that transmits high-frequency signals is illustrated in the drawing. As such, contact pin 24 is inserted to insulating members 25a and 25b and disposed in through hole 23. In this case, base part 20 (upper plate 21 and lower plate 22) is formed of a conductive material, and contact pin 24 is held by through hole 23 through insulating members 25a and 25b.

In addition, through hole 23a includes a reduced diameter part whose diameter is reduced on top surface 20a side, and through hole 23b includes a reduced diameter part whose diameter is reduced on bottom surface 20b side. Contact pin 24 is held by through hole 23a and through hole 23b having the reduced diameter parts through insulating members 25a and 25b so as to prevent contact pin 24 from dropping off from through hole 23.

It is to be noted that the present embodiment is not limited to contact pin 24 that transmits high-frequency signals, and may be applied to other contact pins. In this case, for example, base part 20 (upper plate 21 and lower plate 22) is formed of an insulating material, and the contact pin is directly held by through hole 23 (through holes 23a and 23b).

In addition, upper plate 21 is provided with positioning hole 26a extending through it in the vertical direction, and lower plate 22 is also provided with positioning hole 26b extending through it in the vertical direction. Positioning hole 26a and positioning hole 26b are disposed to form a single positioning hole 26 when upper plate 21 and lower plate 22 are aligned and assembled. That is, positioning hole 26 extends through base part 20 in the vertical direction, and positioning pin 32 described later is inserted to it. The number and installation of positioning holes 26 are formed in accordance with the number and installation of positioning pins 32.

In addition, although not illustrated in the drawing, upper plate 21 is provided with a fastening hole extending through it in the vertical direction, and lower plate 22 is also provided with a fastening hole extending through it in the vertical direction. The fastening hole of upper plate 21 and the fastening hole of lower plate 22 are disposed to form a single fastening hole 27 when upper plate 21 and lower plate 22 are aligned and assembled. That is, fastening hole 27 extends through base part 20 in the vertical direction, and a fastening member such as a bolt is inserted to it, for example. The number and installation of fastening holes 27 are formed in accordance with the number and installation of fastening holes (omitted in the drawing) of wiring board 100 and fastening holes 33 described later. Base part 20, frame part 30 and wiring board 100 are fastened by inserting bolts into the fastening holes and fastening them with nuts, for example.

Frame Part

Frame part 30 is a frame whose center portion is open in the vertical direction. The frame surrounds the opening and constitutes the outer periphery part of housing part 40. In the present embodiment, as an example, the opening has a rectangular shape, and may be appropriately changed in accordance with the shape of the electric component to be housed therein.

In the inner periphery side of frame part 30, i.e., the inner wall of housing part 40, guide part 31 that guides the electric component to a correct position of housing part 40 is provided. Publicly known techniques are applicable to guide part 31 that guides the electric component to a correct position of housing part 40, and therefore the description thereof is omitted here.

The electric component housed in housing part 40 by being guided by guide part 31 to a correct position in housing part 40 is pressed by a pressing member (omitted in the drawing) or the like. Through this pressing, the terminal of the electric component is brought into pressure contact with upper contact end portion 24a of contact pin 24 described later, and thus reliable electrical connection with terminal 102 of wiring board 100 is established through the contact pin. Specifically, when in use, IC socket 10A houses the electric component in housing part 40, and electrically connects the housed electric component and wiring board 100 attached on the lower side of base part 20.

In addition, for the alignment of contact pin 24 and terminal 102 of wiring board 100, frame part 30 is provided with a plurality of positioning pins 32 (the protruding part in the embodiment of the present invention) protruding downward from different locations in bottom surface 30a of frame part 30. In the present embodiment, as illustrated in FIG. 2, positioning pins 32 are provided at two diagonal locations in frame part 30, but the number and installation of positioning pins 32 may be appropriately changed as long as a plurality of positioning pins are provided. Positioning pin 32 is inserted through positioning hole 26 of base part 20 (upper plate 21 and lower plate 22), and is inserted to positioning hole 101 of wiring board 100.

In addition, frame part 30 is provided with fastening hole 33 extending through it in the vertical direction. In the present embodiment, fastening holes 33 are provided at four corners in frame part 30 as illustrated in FIG. 1, but the number and installation of fastening holes 33 may be appropriately changed.

It is to be noted that base part 20 and frame part 30 constituting housing part 40 are separate members in the present embodiment, but base part 20 and frame part 30 may be formed integrally with each other. That is, it suffices that housing part 40 has a configuration that can house the electric component.

In addition, the electric component is an example of the first electric component, and is an IC package in the present embodiment. As the IC package, for example, IC packages such as a ball grid array (BGA) type and a land grid array (LGA) type are applicable. In addition, wiring board 100 is an example of the second electric component, and is a wiring board of an inspection device for conducting the above-described various tests in the present embodiment.

Contact Pin

Contact pin 24 is formed of a conductive material, and electrically connects the electric component and wiring board 100. When IC socket 10A is used, upper contact end portion 24a, which is the upper contact end portion of contact pin 24, makes contact with the terminal (for example, a solder ball) of the electric component. In addition, lower contact end portion 24b (the pin lower end in the embodiment of the present invention), which is the lower contact end portion of contact pin 24, makes contact with terminal 102 of wiring board 100.

As described above, contact pin 24 is provided to extend through base part 20 (upper plate 21 and lower plate 22) in the vertical direction. In this manner, the electric component and wiring board 100 separated from each other in the vertical direction are electrically connected with each other with base part 20 interposed therebetween. It is to be noted that in FIG. 3A and FIG. 3B, one contact pin 24 is illustrated and the illustration of other contact pins is omitted for the sake of simplification.

Examples of the configuration of contact pin 24 itself may include a configuration in which a plunger is protruded from the upper and lower openings of a cylindrical member (barrel), but publicly known techniques are applicable to such a configuration, and therefore the description thereof is omitted.

In the case where high-frequency signals are transmitted between the electric component and wiring board 100, it is desirable that contact pin 24 be configured as a coaxial line and the length of contact pin 24 is set to a small value in order to match the impedance.

Contact pin 24 is provided in accordance with the configuration of the electric component as the inspection object. Contact pin 24 is provided in accordance with the configuration (the number, installation and the like) of the terminal of the electric component, and includes, for example, a contact pin for power source supply, and a contact pin for signal transmission.

As illustrated in FIG. 3A, in a state where attaching of wiring board 100 to base part 20 is started, lower contact end portion 24b of contact pin 24 is exposed downward from bottom surface 20b of base part 20. At this time, upper contact end portion 24a of contact pin 24 is not exposed upward from top surface 20a of base part 20.

In addition, as illustrated in FIG. 3B, in a state where attaching of wiring board 100 to base part 20 is completed, upper contact end portion 24a of contact pin 24 is pushed up by wiring board 100 and exposed upward from top surface 20a of base part 20. At this time, lower contact end portion 24b of contact pin 24 is slightly exposed downward from bottom surface 20b of base part 20 and is in contact with terminal 102 of wiring board 100.

Abutment Part

When attaching wiring board 100 to the bottom surface of base part 20, base part 20 and wiring board 100 are aligned with each other using a plurality of positioning pins 32. At this time, in some cases, the first positioning pin 32 is inserted to positioning hole 101 and wiring board 100 is rotated about the first positioning pin 32 to adjust the position, and then, another positioning pin 32 is inserted to positioning hole 101. In this case, during the adjustment of the position of wiring board 100, lower contact end portion 24b of contact pin 24 may be damaged by catching lower contact end portion 24b of the exposed contact pin 24 at terminal 102 of wiring board 100, and the like.

In addition, for insertion of positioning pin 32, positioning hole 101 of wiring board 100 is formed with an internal diameter slightly larger than the outer diameter of positioning pin 32. That is, positioning pin 32 inserted in positioning hole 101 can move within the range of the internal diameter of positioning hole 101. As such, when attaching wiring board 100 to base part 20, terminal 102 may be shifted from the appropriate position to catch lower contact end portion 24b of contact pin 24 or push up lower contact end portion 24b in a direction tilted with respect to the vertical direction. In this case, when attaching wiring board 100, lower contact end portion 24b of contact pin 24 may be bent and/or broken.

In view of this, in the present embodiment, base part 20 includes holding part 51 that is open on bottom surface 20b side, biasing member 52 disposed in holding part 51, and movable member 53 held by holding part 51 and biased downward by biasing member 52.

In the present embodiment, as an example, as illustrated in FIG. 2, eight movable members 53 are disposed on the outside of a plurality of contact pins 24 to surround a plurality of contact pins 24. In this manner, a plurality of movable members 53 is dispersedly disposed in the circumferential direction with respect to the center of base part 20. For example, a plurality of movable members 53 may be disposed to disperse evenly in the circumferential direction. With such an installation, contact pin 24 can be protected by adjusting the posture of base part 20 with respect to wiring board 100.

It is to be noted that when at least three or more movable members 53 are provided, the posture of base part 20 with respect to wiring board 100 can be adjusted. When the number of movable members 53 is reduced, movable member 53 is at least disposed at a position separated from the positioning pin 32.

On the other hand, the shape of the movable member is not limited to dotted shapes in plan view as that of movable member 53, and may be a shape linearly extending along the width or length of the installation region of contact pin 24, an annularly extending shape that encompasses the installation region of contact pin 24, or the like. In the case where the movable member has a linearly or annularly extending shape, the number of the movable members may not be equal to or greater than three. Regardless of the number and/or shape of the movable member, the wider the region encompassed by the movable member, the more reliably the posture can be adjusted. In addition, the posture can be more reliably adjusted when the center of the region encompassed by the movable member matches the center of the installation region of contact pin 24 or the position of the center of gravity of base part 20.

In the present embodiment, movable member 53 is disposed on the center of base part 20 side with respect to the position of positioning pin 32. For example, in the case where no gap is provided between each contact pin 24, it is disposed on the center side of base part 20 than positioning pin 32 and on the outside of the plurality of contact pins 24, as illustrated in FIG. 2. In addition, in the case where a gap is provided between each contact pin 24, movable member 53 may be disposed in the gap between each contact pin 24.

In this manner, when movable member 53 is disposed on the center side of base part 20 than positioning pin 32, the size of base part 20 is not increased, and the influence on the positioning operation with positioning pin 32 can be suppressed. Then, with movable member 53 disposed in the above-described manner, the impact of terminal 102 of wiring board 100 making contact with lower contact end portion 24b can be prevented or reduced as described later. Holding part 51 and biasing member 52 are provided in accordance with the number and installation of movable members 53.

Upper plate 21 is provided with holding hole 51a extending through it in the vertical direction, and lower plate 22 is also provided with holding hole 51b extending through it in the vertical direction. Holding hole 51a and holding hole 51b are disposed to form a single holding part 51 when upper plate 21 and lower plate 22 are aligned and assembled.

Holding part 51 is open both on top surface 20a side and bottom surface 20b side in FIG. 3A and FIG. 3B as an example, but it suffices that it is open at least on bottom surface 20b side. That is, holding hole 51a may not be open on top surface 20a side. Holding part 51 holds movable member 53 such that movable member 53 is vertically movable at the opening on bottom surface 20b side.

Holding hole 51a includes reduced diameter hole part 51a1 whose diameter is reduced on top surface 20a side. As described later, in holding part 51, biasing member 52 is disposed and the upper end side of biasing member 52 is brought into contact with the bottom surface side of reduced diameter hole part 51a1.

Holding hole 51b includes reduced diameter hole part 51b1 whose diameter is reduced on bottom surface 20b side. Reduced diameter hole part 51b1 prevents movable member 53 from dropping off from holding part 51 by restricting the downward movement of increased diameter part 53c of movable member 53 described later.

Biasing member 52 is disposed in holding part 51 with the lower end side thereof disposed at the outer periphery of protrusion part 53d of movable member 53 described later, the lower end thereof being in contact with the top surface side of increased diameter part 53c of movable member 53, and the upper end side thereof being in contact with the bottom surface side of reduced diameter hole part 51a1 of holding hole 51a. With such an installation, biasing member 52 biases movable member 53 downward. In the present embodiment, biasing member 52 also functions as a buffering member that buffers the force received by movable member 53 from wiring board 100. In this manner, by buffering the force received by movable member 53 from wiring board 100, the impact of terminal 102 making contact with lower contact end portion 24b can be prevented or made a small.

While a coil spring that can provide a sufficient biasing force with a simple configuration is illustrated in the drawing as biasing member 52 as an example, it is also possible to employ a torsion spring, a member different from springs such as an elastic body of rubber and the like, in place of the coil spring, for example. Further, a reactive force may be exerted on wiring board 100 against the force of wiring board 100 pushing up movable member 53 by configuring movable member 53 itself using an elastic body such as rubber, without using biasing member 52 as described later.

Movable member 53 is held by holding part 51 such that movable member 53 is movable in the vertical direction. Movable member 53 includes main body part 53a, abutment lower end 53b, increased diameter part 53c, and protrusion part 53d.

Main body part 53a extends in the vertical direction, and the end portion on the lower side is protruded downward from bottom surface 20b.

Abutment lower end 53b is provided at the end portion of the lower side of main body part 53a, and is capable of abutting on surface 100a of wiring board 100. Abutment lower end 53b is formed as a surface in FIG. 3A and FIG. 3B as an example, but is not limited to a surface as long as a reactive force can be exerted on wiring board 100 against the force of wiring board 100 pushing up movable member 53 as described later.

Here, non-attached position P0 is defined as the position of the lower end of lower contact end portion 24b of contact pin 24 in the state where wiring board 100 is not attached to base part 20 (hereinafter referred to as non-attached state). Along with the movement of movable member 53, abutment lower end 53b moves in the vertical direction between first position P1 below non-attached position P0 and second position P2 above non-attached position P0.

In the non-attached state, there is no wiring board 100 on which abutment lower end 53b is abutted and there is no external force pushing up movable member 53, and therefore abutment lower end 53b moves downward with the downward biasing force of biasing member 52. On the other hand, when attaching wiring board 100 to base part 20, abutment lower end 53b abuts on surface 100a, and movable member 53 is pushed up by wiring board 100. As a result, biasing member 52 is compressed and abutment lower end 53b moves upward. In this manner, abutment lower end 53b moves in the vertical direction between first position P1 and second position P2. That is, with respect to abutment lower end 53b, first position P1 is the position of the non-attached state, and second position P2 is the position of the attached state.

When attaching wiring board 100 to base part 20, abutment lower end 53b in the non-attached state abuts on surface 100a of wiring board 100 earlier than lower contact end portion 24b of contact pin 24 in the non-attached state makes contact with terminal 102. At this time, a reactive force is generated against the force of wiring board 100 pushing up movable member 53, and thus the generated reactive force is exerted on wiring board 100. In this manner, with movable member 53, the impact of terminal 102 of wiring board 100 making contact with lower contact end portion 24*b* can be prevented or made a small, and further, the posture of base part 20 with respect to wiring board 100 can be adjusted.

With the above-described configuration, when attaching wiring board 100 to base part 20, abutment lower end 53*b* abuts on surface 100*a* earlier than lower contact end portion 24*b* of contact pin 24 in the non-attached state makes contact with terminal 102.

It is to be noted that the first position P1 may differ among the plurality of movable members 53 as long as first position P1 is located at a position below non-attached position P0. In this case, it is desirable that first position P1 of movable member 53 close to positioning pin 32 be located at a position lower than first positions P1 of other movable members 53. In this manner, lower contact end portion 24*b* can more reliably abut on terminal 102 after abutment lower end 53*b* abuts on surface 100*a*.

On the other hand, movable member 53 may be configured such that when attaching wiring board 100 to base part 20, abutment lower end 53*b* abuts on surface 100*a* at the same time that lower contact end portion 24*b* makes contact with terminal 102. That is, while first position P1 is below non-attached position P0 in FIG. 3A as an example, first position P1 may be at the same position as non-attached position P0.

Increased diameter part 53*c* is formed with a diameter larger than main body part 53*a*, and disposed between abutment lower end 53*b* and protrusion part 53*d*. As described above, the downward movement of increased diameter part 53*c* is restricted by reduced diameter hole part 51*b*1 of holding hole 51*b* so that movable member 53 does not drop off from holding part 51. In addition, when the downward movement of increased diameter part 53*c* is restricted by reduced diameter hole part 51*b*1 of holding hole 51*b*, abutment lower end 53*b* is located at first position P1.

Protrusion part 53*d* is formed with a diameter smaller than main body part 53*a*, and provided to protrude upward from main body part 53*a*. In the present embodiment, the lower end side of biasing member 52 as a coil spring is disposed at the outer periphery of protrusion part 53*d*. The lower end of biasing member 52 (coil spring) disposed at the outer periphery of protrusion part 53*d* is in contact with increased diameter part 53*c*, and thus protrusion part 53*d* and increased diameter part 53*c* in movable member 53 function also as a seat part of biasing member 52 as a coil spring.

As described above, when attaching wiring board 100 to base part 20, abutment lower end 53*b* abuts on surface 100*a* earlier than or at the same time that lower contact end portion 24*b* makes contact with terminal 102, and thus wiring board 100 can be seated on base part 20. In this manner, the force of terminal 102 pushing up lower contact end portion 24*b* is absorbed by movable member 53, and thus the impact of terminal 102 making contact with lower contact end portion 24*b* can be prevented or made a small. In this manner, bending and/or breaking of lower contact end portion 24*b* of contact pin 24 can be prevented.

In addition, when wiring board 100 is seated on base part 20, the posture of base part 20 is adjusted, and lower contact end portion 24*b* of contact pin 24 and terminal 102 of wiring board 100 face straight each other (for example, contact pin 24 takes a posture perpendicular to wiring board 100). In this manner, a situation where terminal 102 is caught by lower contact end portion 24*b*, and a situation where terminal 102 pushes up lower contact end portion 24*b* in a direction tilted with respect to the vertical direction can be prevented. In this manner, bending and/or breaking of lower contact end portion 24*b* of contact pin 24 can be prevented.

Conclusion

As described above, in the present embodiment, IC socket 10A includes base part 20, contact pin 24, and movable member 53. Movable member 53, which is provided in base part 20, constitutes the abutment part of the embodiment of the present invention and includes abutment lower end 53*b* exposed from bottom surface 20*b* to abut on wiring board 100 and configured to be movable in the vertical direction. Then, in the process of attaching wiring board 100, abutment lower end 53*b* abuts on wiring board 100 approaching base part 20 from below, and thus movable member 53 adjusts the posture of base part 20 with respect to wiring board 100.

According to the present embodiment with the above-mentioned configuration, the force of terminal 102 pushing up lower contact end portion 24*b* is absorbed by movable member 53, and thus the impact of terminal 102 making contact with lower contact end portion 24*b* can be prevented or made a small. In addition, when movable member 53 makes contact with wiring board 100, the posture of base part 20 is adjusted, and terminal 102 of wiring board 100 can face straight lower contact end portion 24*b* of contact pin 24. In this manner, bending and/or breaking of lower contact end portion 24*b* of contact pin 24 can be prevented. That is, when attaching wiring board 100, exposed contact pin 24 can be protected from damage.

Modification 1

Figure 5A:
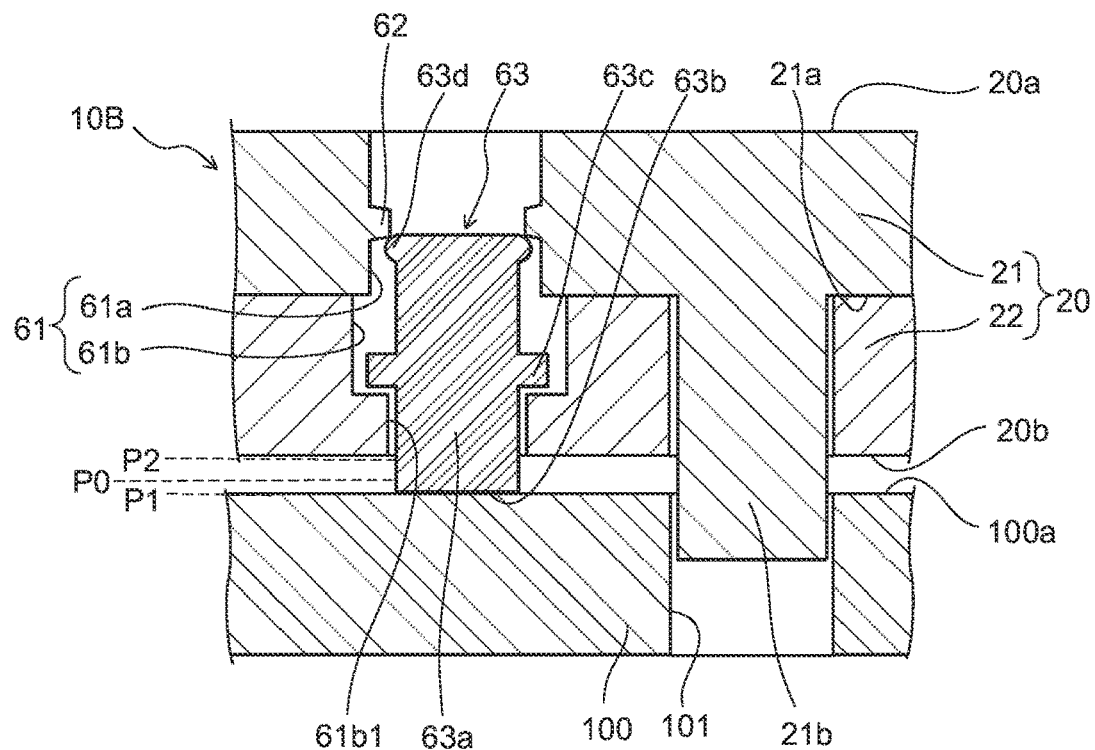
FIG. 5A is a partial sectional view of a socket and a wiring board according to a modification (Modification 1) of the embodiment of the present invention, and illustrates a state where attaching of the wiring board to the socket is started.
Figure 5B:
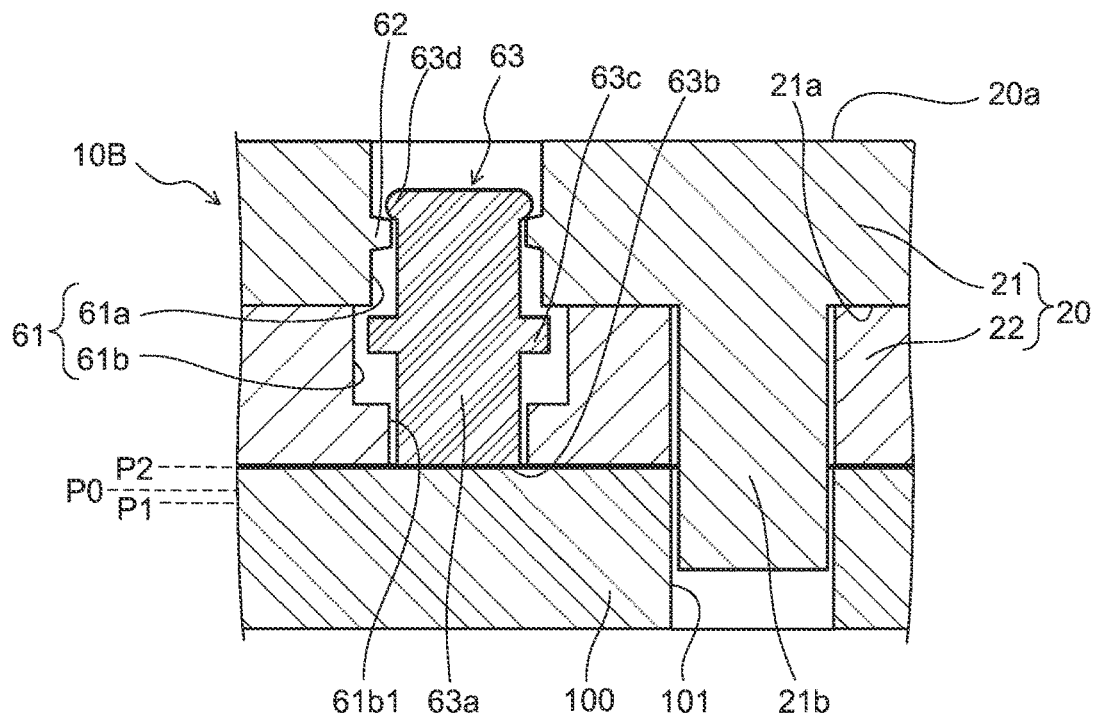
FIG. 5B is a sectional view illustrating the same portion as FIG. 5A, and illustrates a state where attaching of the wiring board to the socket is completed.

FIG. 5A is a partial sectional view illustrating IC socket 10B and wiring board 100 of the present modification, and illustrates a state where attaching of wiring board 100 to IC socket 10B is started. FIG. 5B is a sectional view illustrating the same portion as FIG. 5A, and illustrates a state where attaching of wiring board 100 to IC socket 10B is completed. It is to be noted that although contact pin 24 is not illustrated in FIG. 5A and FIG. 5B, the positional relationship between contact pin 24 and wiring board 100 is the same as that illustrated in FIG. 3A and FIG. 3B, and illustrated with non-attached position P0, first position P1 and second position P2.

In the present modification, basically, IC socket 10B has the same configuration of IC socket 10A of the present embodiment, but mainly differs from IC socket 10A in the positioning pin and the abutment part. Therefore, the same components as those of the above-described embodiment are denoted with the same reference numerals, and reiterated descriptions will be omitted.

Positioning Pin

In the present embodiment, positioning pin 32 for the alignment of contact pin 24 and terminal 102 of wiring board 100 is provided on bottom surface 30*a* side of frame part 30, and inserted to positioning hole 26 of base part 20 and to positioning hole 101 of wiring board 100. In the present modification, positioning pin 21*b* is provided on bottom surface 21*a* side of upper plate 21.

Although not illustrated in the drawing, as with positioning pin 32 of the present embodiment, a plurality of positioning pins 21*b* protrudes downward from different locations in bottom surface 21*a* of upper plate 21. The number and installation of positioning pins 21b may be appropriately changed as long as a plurality of positioning pins 21b are provided. Positioning pin 21b is inserted to positioning hole 26b of lower plate 22, and to positioning hole 101 of wiring board 100.

Abutment Part

In the present modification, base part 20 includes holding part 61 that is open on top surface 20a side and bottom surface 20b side, claw part 62 provided in holding part 61, and movable member 63 held by holding part 61.

In the present modification, the number, installation, and shape of movable member 63 may be the same as those of movable member 53 described in the embodiment. For example, the plurality of movable members 63 is dispersedly disposed in the circumferential direction with respect to the center of base part 20, and is disposed on the center side of base part 20 than the position of positioning pin 21b.

Upper plate 21 is provided with holding hole 61a extending through it in the vertical direction, and lower plate 22 is also provided with holding hole 61b extending through it in the vertical direction. Holding hole 61a and holding hole 61b are disposed to form a single holding part 61 when upper plate 21 and lower plate 22 are aligned and assembled.

It suffices that at least bottom surface 20b side is open in holding part 61, it is desirable that both top surface 20a side and bottom surface 20b side be open as illustrated in FIG. 5A and FIG. 5B for the reason described later. Holding part 61 holds movable member 63 such that movable member 63 is vertically movable at the opening on bottom surface 20b side.

Holding hole 61a includes claw part 62 protruding inward from the inner wall of holding hole 61a toward holding hole 61a. As elaborated later, when pushing up of movable member 63 by wiring board 100 is started, hanging part 63d of movable member 63 described later makes contact with the lower end of claw part 62. Then, when wiring board 100 further pushes movable member 63, hanging part 63d goes over claw part 62 and moves to a position above claw part 62.

Holding hole 61b includes reduced diameter hole part 61b1 whose diameter is reduced on bottom surface 20b side. Reduced diameter hole part 61b1 restricts the downward movement of increased diameter part 63c of movable member 63 described later, so as to prevent movable member 63 from dropping off from holding part 61.

As described above, claw part 62 protrudes inward from the inner wall of holding hole 61a toward holding hole 61a. When pushing up of movable member 63 by wiring board 100 is started, hanging part 63d of movable member 63 makes contact with the lower end of claw part 62, and exerts a reactive force on wiring board 100 against the force of wiring board 100 pushing up movable member 63. Then, when wiring board 100 further pushes movable member 63, hanging part 63d goes over claw part 62, and hanging part 63d moves to a position above claw part 62 so that downward movement of movable member 63 is restricted at the upper end of claw part 62.

When hanging part 63d of movable member 63 makes contact with the lower end of claw part 62, a reactive force is exerted on wiring board 100 against the force of wiring board 100 pushing up movable member 63. It is desirable to adjust the rigidity of hanging part 63d and claw part 62 so as to prevent excessive increase of the force against the vertical movement of movable member 63. For example, desirably, at least one of hanging part 63d and claw part 62 has flexibility, and may be composed of an elastic body such as rubber. When at least one of hanging part 63d and claw part 62 is composed of a member having flexibility or an elastic body, at least one of hanging part 63d and claw part 62 also function as a buffering member that buffers the force received by movable member 63 from wiring board 100 in the present modification. In this manner, by buffering the force received by movable member 63 from wiring board 100, the impact of terminal 102 making contact with lower contact end portion 24b can be prevented or made a small.

Movable member 63 is held by holding part 61 such that movable member 63 is movable in the vertical direction. Movable member 63 includes main body part 63a, abutment lower end 63b, increased diameter part 63c, and hanging part 63d.

Main body part 63a extends in the vertical direction, and the end portion of the lower side protrudes downward from bottom surface 20b.

Abutment lower end 63b is provided at the end portion of the lower side of main body part 63a, and is capable of abutting on surface 100a of wiring board 100. Abutment lower end 63b is formed as a surface in FIG. 5A and FIG. 5B as an example, but is not limited to a surface as long as a reactive force can be exerted on wiring board 100 against the force of wiring board 100 pushing up movable member 63.

The illustration of contact pin 24 is omitted in FIG. 5A and FIG. 5B, but also in this case, non-attached position P0 is defined as the position of the lower end of lower contact end portion 24b of contact pin 24 in the non-attached state where wiring board 100 is not attached to base part 20. Along with the movement of movable member 63, abutment lower end 63b moves in the vertical direction between first position P1 below non-attached position P0 and second position P2 above non-attached position P0.

In the non-attached state, i.e., in the state before wiring board 100 pushes up movable member 63, abutment lower end 63b is located at first position P1. When abutment lower end 63b abuts on surface 100a and wiring board 100 pushes up movable member 63 when attaching wiring board 100 to base part 20, hanging part 63d and/or claw part 62 deflects. When hanging part 63d and/or claw part 62 deflects, hanging part 63d goes over claw part 62, and hanging part 63d moves to a position above claw part 62. In this manner, abutment lower end 63b moves in the vertical direction between first position P1 and second position P2.

It is to be noted that to return abutment lower end 63b to the position of first position P1 after abutment lower end 63b is moved to the position of second position P2, movable member 63 is pushed down from the opening of holding part 61 on top surface 20a side through the use of tools and the like. In this manner, hanging part 63d goes over claw part 62, and hanging part 63d moves to a position downward of claw part 62, and thus, abutment lower end 63b is returned to the position of first position P1.

When attaching wiring board 100 to base part 20, abutment lower end 63b in the non-attached state abuts on surface 100a of wiring board 100 earlier than lower contact end portion 24b of contact pin 24 in the non-attached state makes contact with terminal 102. At this time, hanging part 63d of movable member 63 makes contact with the lower end of claw part 62, and a reactive force against the force of wiring board 100 pushing up movable member 63 is generated, thus applying the generated reactive force to wiring board 100. In this manner, with movable member 63, the impact of terminal 102 of wiring board 100 making contact with lower contact end portion 24b can be prevented or made a small, and further, the posture of base part 20 with respect to wiring board 100 can be adjusted.

With the above-described configuration, when attaching wiring board 100 to base part 20, abutment lower end 63b abuts on surface 100a earlier than lower contact end portion 24b of contact pin 24 in the non-attached state makes contact with terminal 102.

It is to be noted that first position P1 may differ among the plurality of movable members 63 as long as it is located at a position lower than non-attached position P0. In this case, it is desirable that first position P1 of movable member 63 close to positioning pin 32 is located at a position downward of first positions P1 of other movable members 63. In this manner, it is possible to more reliably bring lower contact end portion 24b into contact with terminal 102 after abutment lower end 63b abuts on surface 100a.

On the other hand, abutment lower end 63b may be configured to abut on surface 100a at the same time that lower contact end portion 24b of contact pin 24 makes contact with terminal 102 when attaching wiring board 100 to base part 20. That is, while first position P1 is below non-attached position P0 in FIG. 5A as an example, first position P1 may be at the same position as non-attached position P0.

Increased diameter part 63c is formed with a diameter larger than main body part 63a, and is disposed between abutment lower end 63b and hanging part 63d. As described above, the downward movement of increased diameter part 63c is restricted by reduced diameter hole part 61b1 of holding hole 61b, so as to prevent movable member 63 from dropping off from holding part 61. In addition, when the downward movement of increased diameter part 63c is restricted by reduced diameter hole part 61b1, abutment lower end 63b is located at first position P1.

At main body part 63a above increased diameter part 63c, hanging part 63d is provided to protrude outward from the outer peripheral surface of main body part 63a. The outer diameter at hanging part 63d is slightly greater than the internal diameter at claw part 62. In addition, the surface of hanging part 63d on claw part 62 side is formed into a curved surface, e.g., a curved surface with a semicircular cross-sectional shape in FIG. 5A and FIG. 5B, so that the contact area of hanging part 63d that makes contact with claw part 62 is as small as possible. That is, it is desirable to adjust the shape of hanging part 63d so as to prevent excessive increase of the force against the vertical movement of movable member 63.

With hanging part 63d having the above-described configuration, when pushing up of movable member 63 by wiring board 100 is started, hanging part 63d makes contact with the lower end of claw part 62, and a reactive force is exerted on wiring board 100 against the force of wiring board 100 pushing up movable member 63 as described above. Then, when wiring board 100 further pushes movable member 63, hanging part 63d goes over claw part 62, and hanging part 63d moves to a position above claw part 62 so that the downward movement of movable member 63 is restricted at the upper end of claw part 62.

In this manner, when attaching wiring board 100 to base part 20, abutment lower end 53b abuts on surface 100a earlier than or at the same time that lower contact end portion 24b makes contact with terminal 102, and thus wiring board 100 can be seated on base part 20. Thus, the force of terminal 102 pushing up lower contact end portion 24b is absorbed by movable member 63, and the impact of terminal 102 making contact with lower contact end portion 24b can be prevented or made a small. In this manner, bending and/or breaking of lower contact end portion 24b of contact pin 24 can be prevented.

In addition, when wiring board 100 is seated on base part 20, the posture of base part 20 is adjusted, and lower contact end portion 24b of contact pin 24 and terminal 102 of wiring board 100 face straight each other. Thus, a situation where terminal 102 is caught by lower contact end portion 24b, and a situation where terminal 102 pushes up lower contact end portion 24b in a direction tilted with respect to the vertical direction can be prevented. In this manner, bending and/or breaking of lower contact end portion 24b of contact pin 24 can be prevented.

Conclusion

As described above, in the present modification, IC socket 10B includes base part 20, contact pin 24, and movable member 63. Movable member 63 constitutes the abutment part of the embodiment of the present invention. Movable member 63 is provided in base part 20 and provided with abutment lower end 63b configured to be movable in the vertical direction and exposed from bottom surface 20b so as to abut on wiring board 100. Then, in the process of attaching wiring board 100, abutment lower end 63b abuts on wiring board 100 approaching base part 20 from below, and thus movable member 63 adjusts the posture of base part 20 with respect to wiring board 100.

According to the present modification with the above-mentioned configuration, the force of terminal 102 pushing up lower contact end portion 24b is absorbed by movable member 63, and the impact of terminal 102 making contact with lower contact end portion 24b can be prevented or made a small. In addition, when movable member 63 makes contact with wiring board 100, the posture of base part 20 is adjusted, and terminal 102 of wiring board 100 can face straight lower contact end portion 24b of contact pin 24. In this manner, bending and/or breaking of lower contact end portion 24b of contact pin 24 can be prevented. That is, when attaching wiring board 100, exposed contact pin 24 can be protected from damage.

Modification 2

Figure 6A:
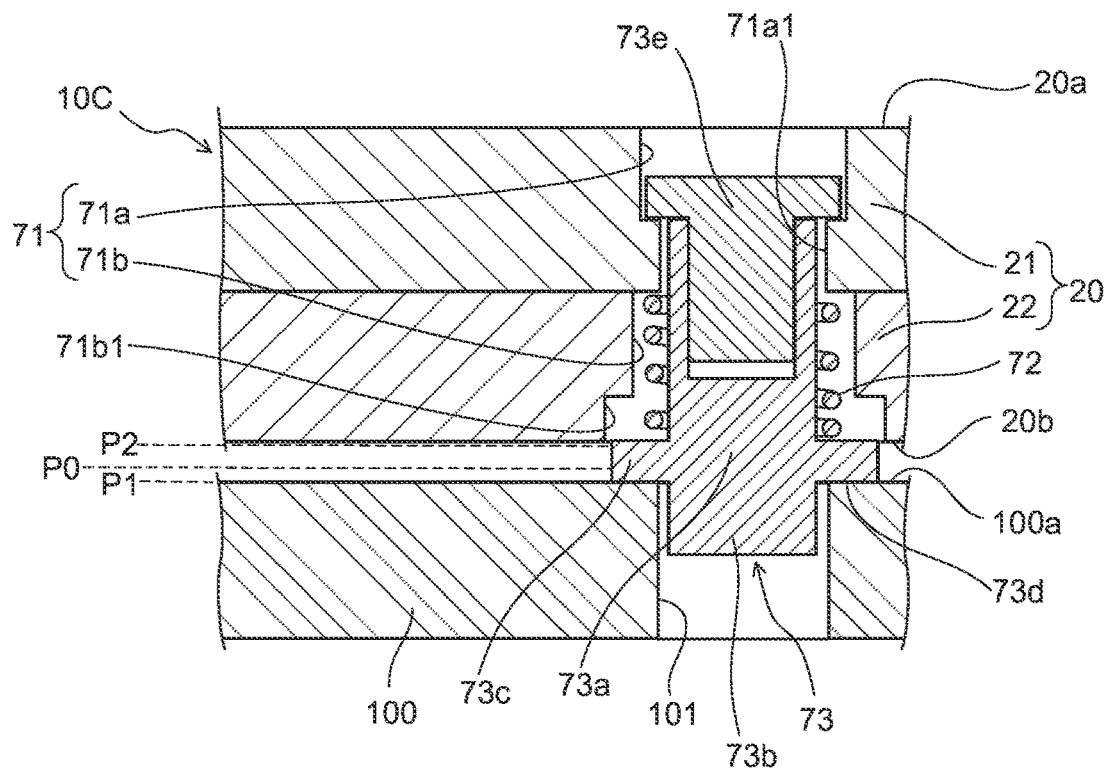
FIG. 6A is a partial sectional view of a socket and a wiring board according to a modification (Modification 2) of the embodiment of the present invention, and illustrates a state where attaching of the wiring board to the socket is started.
Figure 6B:
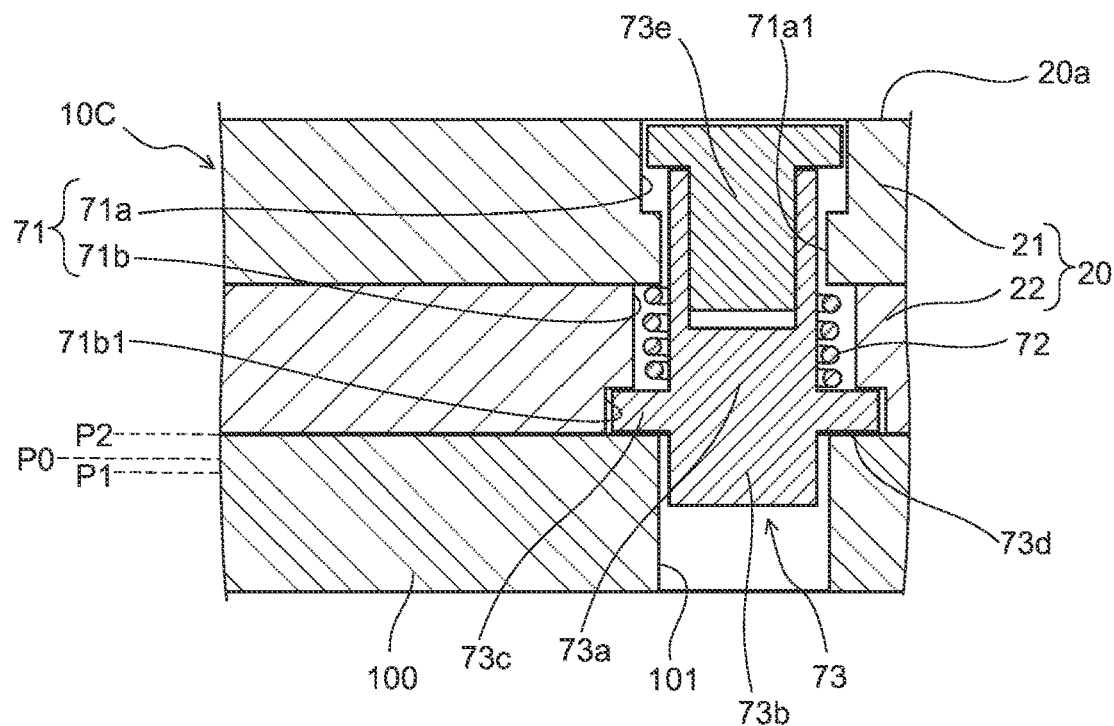
FIG. 6B is a sectional view illustrating the same portion as FIG. 6A, and illustrates a state where attaching of the wiring board to the socket is completed.

FIG. 6A is a partial sectional view illustrating IC socket 10C and wiring board 100 of the present modification, and illustrates a state where attaching of wiring board 100 to IC socket 10C is started. FIG. 6B is a sectional view illustrating the same portion as FIG. 6A, and illustrates a state where attaching of wiring board 100 to IC socket 10C is completed. It is to be noted that while the illustration of contact pin 24 is omitted also in FIG. 6A and FIG. 6B, the positional relationship between contact pin 24 and wiring board 100 is the same as that illustrated in FIG. 3A and FIG. 3B, and illustrated with non-attached position P0, first position P1 and second position P2.

In the present modification, basically, IC socket 10C has the same configuration as that of IC socket 10A of the embodiment, but mainly differs from IC socket 10A in the positioning pin and the abutment part since the abutment part is provided at the positioning pin. Therefore, the same components as those of the above-described embodiment are denoted with the same reference numerals, and reiterated descriptions will be omitted.

Positioning Pin and Abutment Part

In the embodiment, positioning pin 32 for the alignment of contact pin 24 and terminal 102 of wiring board 100 is provided on bottom surface 30a side of frame part 30, and inserted to positioning hole 26 of base part 20 and to positioning hole 101 of wiring board 100. In the present modification, as described later, lower increased diameter part 73c that functions as an abutment part is provided at positioning pin 73, in place of positioning pin 32, movable member 53 and the like of the embodiment. Then, as described later, positioning pin 73 is held in holding part 71 provided at base part 20 (upper plate 21 and lower plate 22) such that positioning pin 73 is movable in the vertical direction, and is inserted to positioning hole 101 of wiring board 100.

Although not illustrated in the drawing, as with positioning pin 32 of the embodiment, a plurality of positioning pins 73 is provided to protrude downward from different locations in bottom surface 20b of base part 20. In the present modification, positioning pin 73 is provided with lower increased diameter part 73c that functions as an abutment part, and therefore the number, installation and shape of positioning pin 73 may be the same as those of movable member 53 described in the embodiment. For example, three or more positioning pins 73 are provided and dispersedly disposed in the circumferential direction with respect to the center of base part 20.

In the present modification, base part 20 includes holding part 71 that is open on top surface 20a side and bottom surface 20b side, biasing member 72 disposed in holding part 71, and positioning pin 73 (the movable member of the embodiment of the present invention) held by holding part 71 and configured to be biased downward by biasing member 72.

In the present modification, holding part 71 and biasing member 72 are provided in accordance with the number and installation of positioning pins 73.

Upper plate 21 is provided with holding hole 71a extending through it in the vertical direction, and lower plate 22 is also provided with holding hole 71b extending through it in the vertical direction. Holding hole 71a and holding hole 71b are disposed to form a single holding part 71 when upper plate 21 and lower plate 22 are aligned and assembled.

Holding part 71 is open on both of top surface 20a side and bottom surface 20b side. At the opening on bottom surface 20b side, holding part 71 holds positioning pin 73 such that positioning pin 73 is vertically movable.

Holding hole 71a includes reduced diameter hole part 71a1 whose diameter is reduced. Reduced diameter hole part 71a1 restricts the downward movement of upper increased diameter part 73e of positioning pin 73 described later so as to prevent dropping off of positioning pin 73 from holding part 71.

Holding hole 71b includes increased diameter hole part 71b1 whose diameter is increased on bottom surface 20b side. Reduced diameter hole part 71a1 is formed such that reduced diameter hole part 71a1 can house lower increased diameter part 73c of positioning pin 73 described later.

Biasing member 72 is disposed in holding part 71 with the lower end side thereof being in contact with the top surface side of lower increased diameter part 73c of positioning pin 73 described later, and the upper end side thereof being in contact with the bottom surface side of increased diameter hole part 71b1. With such an installation, biasing member 72 biases positioning pin 73 downward. In the present modification, biasing member 72 also functions as a buffering member that buffers the force received by positioning pin 73 from wiring board 100. As described above, by buffering the force received by positioning pin 73 from wiring board 100, the impact of terminal 102 making contact with lower contact end portion 24b can be prevented or made a small.

It is to be noted that while a coil spring that can provide a sufficient biasing force with a simple configuration is illustrated in the drawing as biasing member 72 as an example, it is also possible to employ a torsion spring, a member different from a spring such as rubber and the like, in place of the coil spring, for example.

Positioning pin 73 is held by holding part 71 such that positioning pin 73 is movable in the vertical direction. Positioning pin 73 includes main body part 73a, insertion part 73b, lower increased diameter part 73c, abutment lower end 73d, and upper increased diameter part 73e.

Main body part 73a is extended in the vertical direction, with the end portion of the lower side serving as insertion part 73b configured to be inserted to positioning hole 101 of wiring board 100.

Lower increased diameter part 73c is formed with a diameter larger than main body part 73a, and the bottom surface thereof serves as abutment lower end 73d configured to abut on surface 100a of wiring board 100. Abutment lower end 73d is formed as a surface as an example in FIG. 6A and FIG. 6B, but is not limited to a surface as long as a reactive force can be exerted on wiring board 100 against the force of wiring board 100 pushing up positioning pin 73, as described later.

The illustration of contact pin 24 is omitted in FIG. 6A and FIG. 6B, but also in this case, non-attached position P0 is defined as the position of the lower end of lower contact end portion 24b of contact pin 24 in the non-attached state where wiring board 100 is not attached to base part 20. Along with the movement of positioning pin 73, abutment lower end 73d moves in the vertical direction between first position P1 below non-attached position P0 and second position P2 above non-attached position P0.

In the non-attached state, there is no contact wiring board 100 on which abutment lower end 73d is abutted, and there is no external force pushing up positioning pin 73, and therefore abutment lower end 73d moves downward with the downward biasing force of biasing member 72. On the other hand, when attaching wiring board 100 to base part 20, abutment lower end 73d makes abuts on surface 100a, and wiring board 100 pushes up positioning pin 73. As a result, biasing member 72 is compressed, and abutment lower end 73d moves upward. In this manner, abutment lower end 73d moves in the vertical direction between first position P1 and second position P2.

When attaching wiring board 100 to base part 20, abutment lower end 73d in the non-attached state abuts on surface 100a of wiring board 100. At this time, a reactive force against the force of wiring board 100 pushing up positioning pin 73 is generated, and the generated reactive force is applied to wiring board 100. In this manner, with positioning pin 73, the impact of terminal 102 of wiring board 100 making contact with lower contact end portion 24b can be prevented or made a small, and further, the posture of base part 20 with respect to wiring board 100 can be adjusted.

With the above-described configuration, when attaching wiring board 100 to base part 20, abutment lower end 73d abuts on surface 100a earlier than lower contact end portion 24b of contact pin 24 in the non-attached state makes contact with terminal 102.

It is to be noted that when attaching wiring board 100 to base part 20, abutment lower end 73d may be configured to abut on surface 100a at the same time that lower contact end portion 24b of contact pin 24 makes contact with terminal 102. That is, while first position P1 is below non-attached position P0 in FIG. 6A as an example, first position P1 may be at the same position as non-attached position P0.

Upper increased diameter part 73e is formed with a diameter larger than main body part 73a, and is formed as another member separated from main body part 73a, insertion part 73b, lower increased diameter part 73c and abutment lower end 73d. The reason for this is that if main body part 73a, insertion part 73b, lower increased diameter part 73c, abutment lower end 73d and upper increased diameter part 73e are integrally configured, positioning pin 73 cannot be inserted into holding part 71 because of lower increased diameter part 73c and upper increased diameter part 73e. Therefore, positioning pin 73 is configured by inserting main body part 73a, insertion part 73b, lower increased diameter part 73c and abutment lower end 73d from the opening on bottom surface 20b side, inserting upper increased diameter part 73e from the opening on top surface 20a side, and, fastening upper increased diameter part 73e to main body part 73a. In this manner, positioning pin 73 is inserted into holding part 71.

As described above, the downward movement of upper increased diameter part 73e is restricted by reduced diameter hole part 71a1, and thus dropping off of positioning pin 73 from holding part 71 is prevented.

In this manner, when attaching wiring board 100 to base part 20, abutment lower end 73d abuts on surface 100a earlier than or at the same time that lower contact end portion 24b makes contact with terminal 102, and thus wiring board 100 can be seated on base part 20. In this manner, the force of terminal 102 pushing up lower contact end portion 24b is absorbed by positioning pin 73, and thus the impact of terminal 102 making contact with lower contact end portion 24b can be prevented or made a small. In this manner, bending and/or breaking of lower contact end portion 24b of contact pin 24 can be prevented.

In addition, when wiring board 100 is seated on base part 20, the posture of base part 20 is adjusted, and lower contact end portion 24b of contact pin 24 and terminal 102 of wiring board 100 face straight each other. In this manner, a situation where terminal 102 is caught by lower contact end portion 24b, and a situation where terminal 102 pushes up lower contact end portion 24b in a direction tilted with respect to the vertical direction can be prevented. In this manner, bending and/or breaking of lower contact end portion 24b of contact pin 24 can be prevented.

Conclusion

As described above, in the present modification, IC socket 10C includes base part 20, contact pin 24, and positioning pin 73. Positioning pin 73, which is provided with the abutment part of the embodiment of the present invention and provided in base part 20, includes abutment lower end 73d exposed from bottom surface 20b to abut on wiring board 100 and configured to be movable in the vertical direction. In the process of attaching wiring board 100, abutment lower end 73d abuts on wiring board 100 approaching base part 20 from below, and positioning pin 73 adjusts the posture of base part 20 with respect to wiring board 100.

According to the present modification with the above-mentioned configuration, the force of terminal 102 pushing up lower contact end portion 24b is absorbed by positioning pin 73, and thus the impact of terminal 102 making contact with lower contact end portion 24b can be prevented or made a small. In addition, when positioning pin 73 makes contact with wiring board 100, the posture of base part 20 is adjusted, and terminal 102 of wiring board 100 can face straight lower contact end portion 24b of contact pin 24. In this manner, bending and/or breaking of lower contact end portion 24b of contact pin 24 can be prevented. That is, when attaching wiring board 100, exposed contact pin 24 can be protected from damage.

The above-mentioned embodiments are merely examples of embodiments in implementing the invention, and the technical scope of the invention should not be interpreted in a limited manner by these examples. In other words, the present invention can be implemented in various ways without deviating from its gist or its main features.

INDUSTRIAL APPLICABILITY

The socket and the inspection socket according to the present invention are suitable for IC sockets that house electric components such as ICs on a wiring board, for example.

REFERENCE SIGNS LIST 10A, 10B, 10C IC Socket
20 Base part
20a Top surface
20b Bottom Surface
21 Upper plate
21a Bottom surface
21b Positioning pin
22 Lower plate
23, 23a, 23b Through hole
24 Contact pin
24a Upper contact end portion
24b Lower contact end portion
25a, 25b Insulating member
26, 26a, 26b Hole
27 Fastening hole
30 Frame part
30a Bottom surface
31 Guide part
32 Positioning pin
33 Fastening hole
40 Housing part
51 Holding part
51a, 51b Holding hole
52 Biasing member
53 Movable member
53a Main body part
53b Abutment lower end
53c Increased diameter part
53d Protrusion part
61 Holding part
61a, 61b Holding hole
62 Claw part
63 Movable member
63a Main body part
63b Abutment lower end
63c Increased diameter part
63d Hanging part
71 Holding part
71a, 71b Holding hole
71a1 Reduced diameter hole part
71b1 Increased diameter hole part
72 Biasing member
73 Positioning pin
73a Main body part
73b Insertion part 73c Lower increased diameter part
73d Abutment lower end
73e Upper increased diameter part
100 Wiring board
100a Surface
101 Hole
102 Terminal

The invention claimed is:

1. A socket configured to electrically connect a first electric component and a second electric component, the socket comprising:
   a base part including a top surface on which the first electric component is placed and a bottom surface to which the second electric component is attached;
   a contact pin provided to extend through the base part and including a pin lower end exposed from the bottom surface, the contact pin being configured to electrically connect the first electric component and the second electric component; and
   an abutment part provided in the base part, and including an abutment lower end, the abutment lower end being exposed from the bottom surface to abut on the second electric component and configured to be movable in a vertical direction, the abutment part being configured such that the abutment lower end abuts on the second electric component approaching the base part from below, earlier than a timing of contact of the pin lower end to the second electric component in a process of attaching the second electric component to adjust a posture of the base part with respect to the second electric component without electrically connecting the first electric component and the second electric component.

2. The socket according to claim 1, wherein in a non-attached state of the second electric component, the abutment lower end is disposed at a position lower than the pin lower end in the vertical direction.

3. The socket according to claim 1, further comprising a plurality of protruding parts protruding downward from different locations in the bottom surface, the plurality of protruding parts being configured for alignment of the contact pin and the second electric component,
   wherein the abutment part is disposed on a center side of the base part with respect to the plurality of protruding parts.

4. The socket according to claim 1, wherein the abutment part includes a plurality of abutment parts dispersedly disposed in a circumferential direction of a center of the base part.

5. The socket according to claim 1, wherein
   the abutment part includes a movable member held by the base part such that the movable member is movable in the vertical direction; and
   the movable member is movable in the vertical direction at least between a first position and a second position, the first position being a same position as a position of the pin lower end in the vertical direction in a non-attached state of the second electric component, the second position being a same position as a position of the pin lower end in the vertical direction in an attached state of the second electric component.

6. The socket according to claim 1, further comprising a buffering member configured to buffer a force received at the abutment part from the second electric component.

7. An inspection socket configured to be used for inspection of electrical characteristics of the first electric component, the inspection socket comprising:
   the socket according to claim 1.

* * * * *